United States Patent
Wendt

[11] Patent Number: 5,345,557
[45] Date of Patent: Sep. 6, 1994

[54] DIGITAL COMPUTER WITH OPTICALLY INTERCONNECTED MULTIPROCESSOR ARRANGEMENT

[76] Inventor: Hans-Joachim Wendt, Sachsenbergstrasse 13a, DE-2150 Buxtehude, Fed. Rep. of Germany

[21] Appl. No.: 773,940
[22] PCT Filed: Oct. 4, 1989
[86] PCT No.: PCT/EP89/01162
§ 371 Date: Sep. 19, 1991
§ 102(e) Date: Sep. 19, 1991
[87] PCT Pub. No.: WO90/04835
PCT Pub. Date: May 3, 1990

[30] Foreign Application Priority Data
Oct. 19, 1988 [EP] European Pat. Off. .......... 3835601.5

[51] Int. Cl.5 .......................... G06F 13/00; G06F 1/26
[52] U.S. Cl. .................... 395/200; 385/130; 364/713; 395/750
[58] Field of Search ........... 364/DIG. 1, DIG. 2, 364/712, 713; 385/14, 15, 130; 395/200, 275

[56] References Cited

U.S. PATENT DOCUMENTS

| | | | |
|---|---|---|---|
| 4,007,978 | 2/1977 | Holton | 385/14 |
| 4,732,446 | 3/1988 | Gipson et al. | 385/24 |
| 4,939,682 | 7/1990 | Falk | 364/713 |
| 5,009,476 | 4/1991 | Reid et al. | 385/14 |
| 5,159,700 | 10/1992 | Reid et al. | 385/14 |

OTHER PUBLICATIONS

Proceedings of the IEEE vol. 72 No. 7 pp. 850–866 Jul. 1984.

Primary Examiner—Robert L. Richardson
Attorney, Agent, or Firm—Dominik, Stein, Saccocio, Reese, Colitz & VanDerWall

[57] ABSTRACT

In a digital computer with multiprocessor arrangement, each processor is a highly integrated computer chip on a semiconductor basis connected to the other processors in the arrangement, which are of same design, via highly meshed management system composed of meshes and nodes for transmitting digital signals. Peripheral devices such as keyboards, memories, monitors, image sensors, speech analysis units, speech synthesis units as well as transmitters are connected to the computer. According to the invention, the management system is a beam waveguide network. Each node is associated with a processor to which it is coupled via an optical emitter and an optical receiver. The new types of chip interconnection which result and hence the high packing density of the chips and large number of cross-connections obtained are particularly advantageous. The computer network has a high functional density and the computer and peripherals are unaffected by electromagnetic influences.

7 Claims, 9 Drawing Sheets

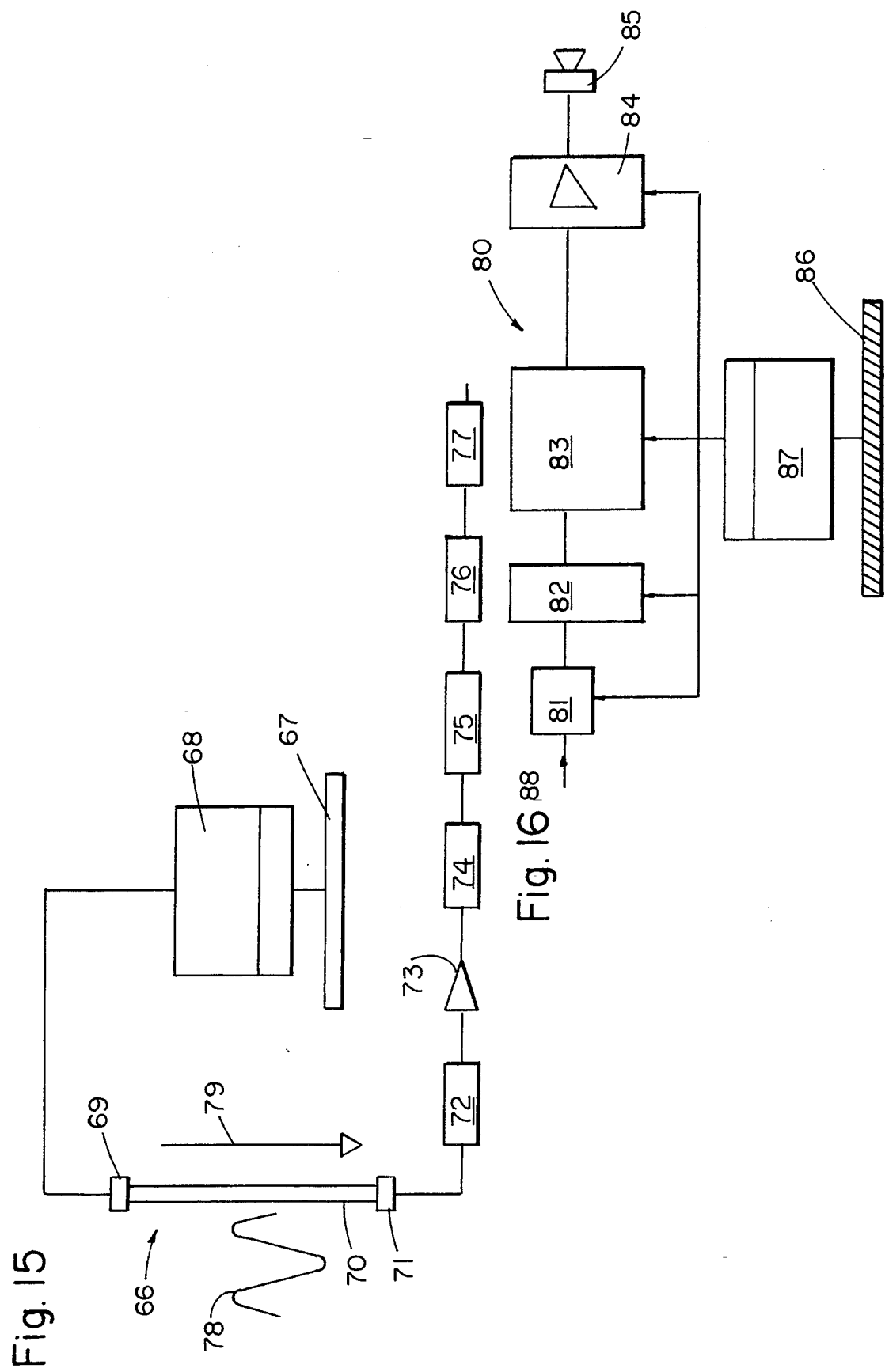

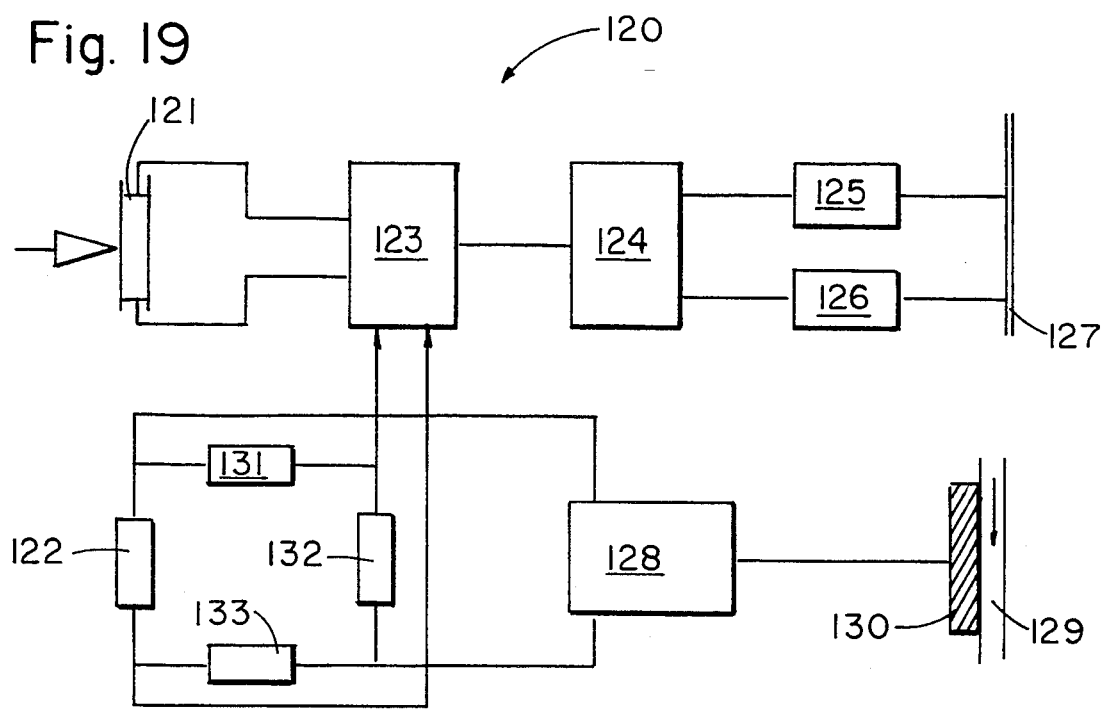
Fig. 19
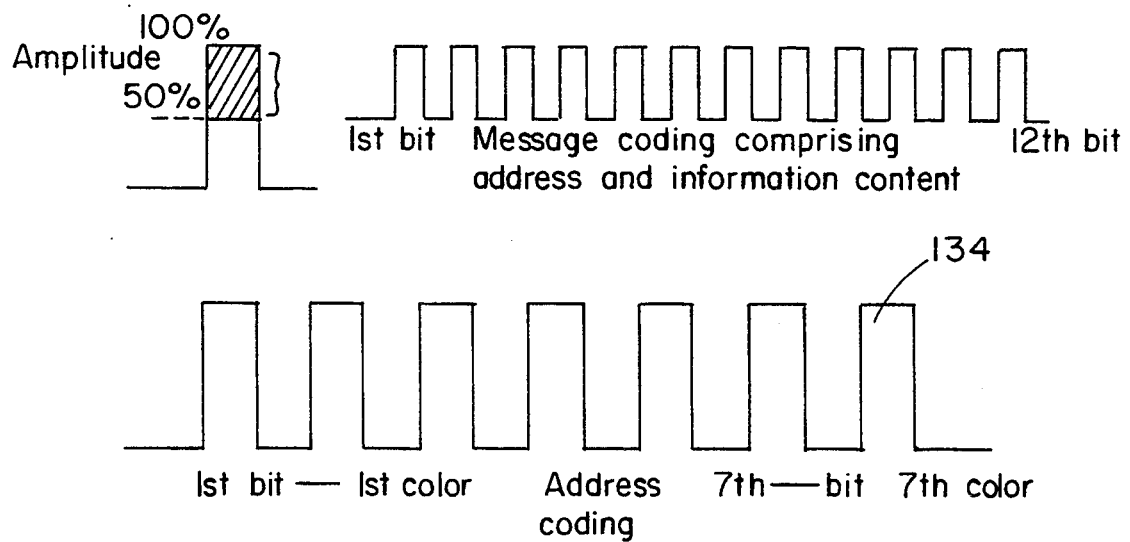
Fig. 20  Signal difference
1st bit  Message coding comprising  12th bit
address and information content
1st bit — 1st color    Address    7th—bit  7th color
coding

DIGITAL COMPUTER WITH OPTICALLY INTERCONNECTED MULTIPROCESSOR ARRANGEMENT

BACKGROUND OF THE INVENTION

According to current know-how, computer-relevant signals can be transmitted both electrically and optically. In this respect the possibility exists in principle of using both types of transmission outside and inside the computer chips. The development of optical chips is being pursued at present, but has not reached anything like the advanced state, in particular in miniaturization, already attained in the case of electronic chips. Thus, there are both optical and electronic components for computers, to construct circuits by the one type of transmission or the other. In addition, there are so-called optronic components for the realization of transitions between circuit regions having a different type of transmission.

In the case of digital computers of the generic type, a plurality of processor units are operated simultaneously, in order to increase the computer speed. Wherever this concerns computers with neural networks, a more or less pronounced adaptiveness of the computers can be achieved by the simultaneous operation of many processors. The individual functional units, processors and storage devices have a high packing density in the case of electronic chips. The space requirement of processors is reduced and thereby the length of the internal transmission paths is shortened. The high packing density is achieved by the individual electronic switching elements arranged on a chip being miniaturized to an ever greater degree with the aid of electron-beam lithography. Considerable functional densities are already attainable with computer systems based on such chips. Nevertheless, it can be foreseen that there are limits to the development of purely electronic supercomputers. What is meant here by "supercomputers" is adaptive computers, which are conceivable only in multiprocessor arrangements in the form of neural networks, it being possible, according to the application, for the number of interacting processors to be, for example, in the tens of thousands, or even higher by orders of magnitude. Computer structures with such numbers of individual processors can no longer be realized by processors of a conventional type if acceptable hardware dimensions are to be maintained. In US-Z Aerospace America/June 1988, page 40, column 2, lines 28 to 41, a computer is described which is based on VLSIC technology (Very Large Scale Integrated Chip) and can execute 250,000 processes and 5 million cross-connections. Here it is then also stated that, depending on the application, some millions of cross-connections may be far too few. For example, pattern recognition by means of an optical recording member having a million optoelectrically active individual elements requires a number of cross-connections between the individual units of the computer which goes into the billions. In order to advance development in this direction, new ways of chip contacting would have to be found, since the interconnection of such large numbers of processors is very restricted by current contacting technology. With this technology, the individual chips are connected to the rest of the computer circuit by solder connections usually arranged on the edges of their packages.

As far as producing supercomputers of the above-mentioned type is concerned, the electronic type of transmission offers the following advantage:

The possibilities of miniaturization can be fully utilized in chip production. In this case, component dimensions, for example conductor track widths, of 0.01 $\mu$m can be realized.

However, on the other hand there are the following disadvantages:

The necessary high number of cross-connections outside the chips hinders the development of supercomputers tremendously.

Like all such lines, electrical cross-connections are very sensitive to electromagnetic interference fields.

The inductances and capacitances always present on electrical transmission paths have the effect of considerably restricting the transmission rate and the transmission band widths on these paths.

If one considers the feasibility of optical concepts for the realization of supercomputers, the following disadvantage is encountered in particular:

Optical chips previously realized or conceived do not have the high degree of miniaturization such as that already achieved in the case of electronic chips.

However, the following is advantageous in the case of optical computer concepts:

The transmission paths concerned are insensitive to electromagnetic interference fields.

Optical transmission paths have neither disturbing inductances nor capacitances.

The question of optical or electrical arises not only with respect to the chips and their connections to one another but also with respect to the peripherals of a computer, that is to say with respect to the screens, keyboards, sensors, drive circuits and so on. In order to make these devices as insensitive to electromagnetic influences as possible, they are usually shielded appropriately, it already being possible for the data lines to be realized by optical waveguides. For protection against interferences getting into the devices via the supply lines, further interference suppression measures are necessary. Corresponding solutions are relatively complex, in particular owing to the shielding and filter arrangements required.

OBJECTS OF THE INVENTION

Accordingly, the invention is based on the objective of designing a computer of the generic type, and the peripheral devices interacting with it, in such a way that the advantages of the optical type of transmission are combined in it with the advantages of electronic signal processing in such a way that the computer and the peripheral devices are distinguished by a substantial immunity to electromagnetic influences, it being possible to realize the numbers of cross-connections typical for supercomputers.

In this case, it is particularly advantageous that new ways of chip interconnection are obtained, so that a high packing density of the chips and a great number of cross-connections is achieved; this results in a high functional density of the computer network with simultaneous immunity of the computer and of the peripheral devices to electromagnetic influences.

BRIEF DESCRIPTION OF THE DRAWINGS

The invention is represented by means of the drawing and explained in greater detail in the description of an example. In the drawing:

FIG. 15 shows a microphone with wiring,
FIG. 16 shows a voice output part,
FIG. 19 shows a combined pressure/temperature sensor and
FIG. 20 shows a signal structure.

DETAILED DESCRIPTION OF THE PREFERRED EMBODIMENT

Figure 1:
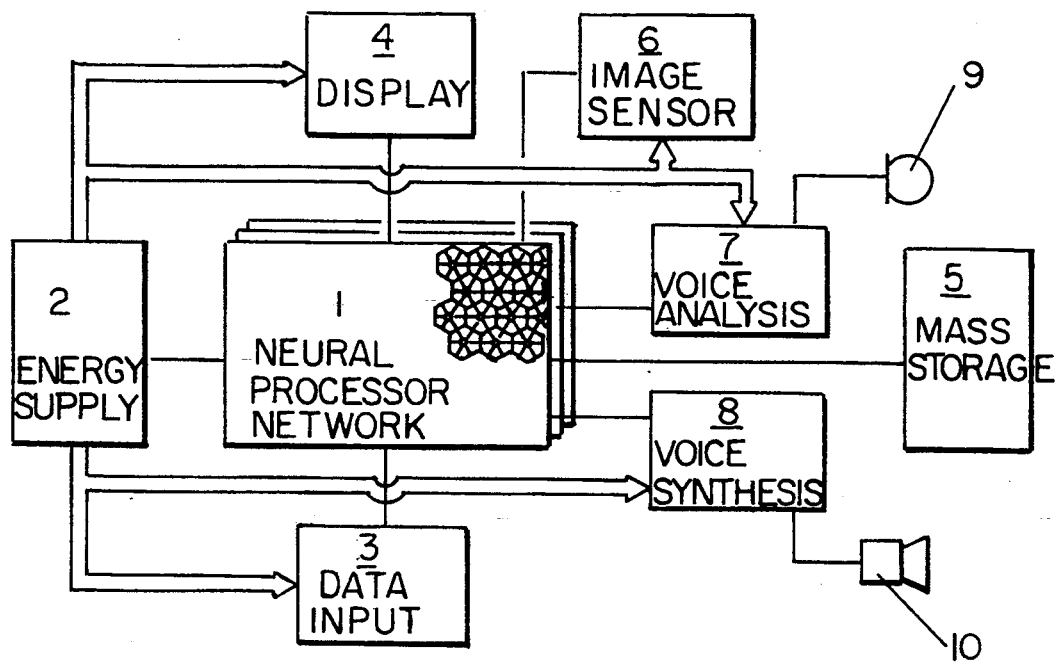
FIG. 1 shows a block diagram of a supercomputer.

FIG. 1 shows a block diagram of a computer according to the invention with a neural processor network 1, the following functional units being connected. An energy supply unit 2, a data input field 3, a display unit 4, a magnetic mass store 5, an image sensor 6, a voice analysis unit 7 and a voice synthesis unit 8. Furthermore, as shown, the energy supply unit 2 is in connection with each of the units 3 to 8. The processor network 1 has several hundred thousand individual processor chips, which with one another form a highly meshed network. The lines shown in the diagram are designed as optical waveguides. All inputs and outputs of the individual functional units have optoelectronic transducers connected to the optical waveguides. The energy lines coming from the energy supply unit 2 are also designed as optical waveguides. On account of the highly meshed neural network 1, this computer is adaptive to a certain extent and, apart from the usual logical operations, can also execute such operations in pattern recognition. In this case, both an optical pattern recognition and an acoustic pattern recognition can be implemented. In the case of optical pattern recognition, the signal input into the computer 1 is performed by the image sensor 6 and/or by the mass storage 5. In the case of acoustic pattern recognition, the data input is performed by the voice analysis unit 7, which interacts with a microphone 9. The voice output is performed by means of the voice synthesis unit 8, to which a loudspeaker 10 is connected.

Figure 2:
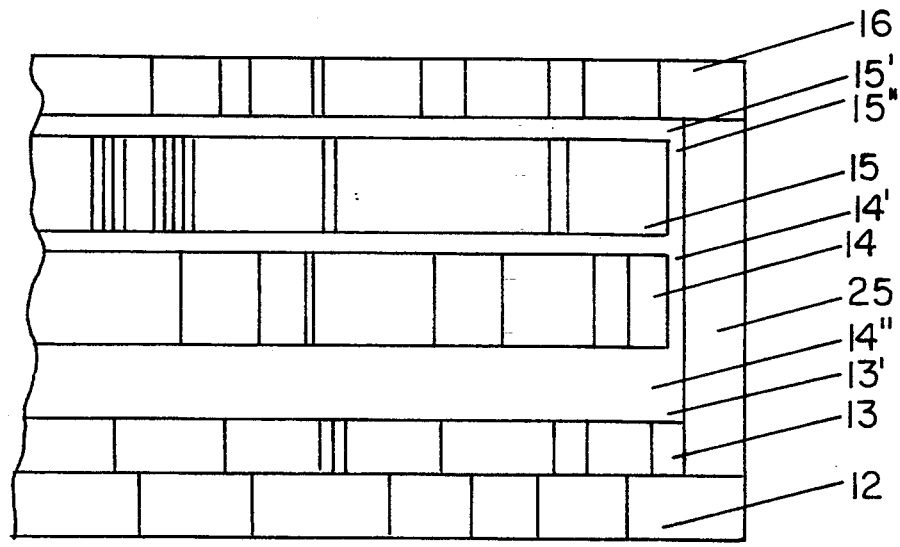
FIG. 2 shows a cross-section through a multilayered chip.

FIG. 2 diagrammatically shows a cross-section through an individual processor chip 11, as is used in the above processor network 1. This chip contains a complete processor and forms the basis of the computer circuit. The chip specifically comprises a metallic carrier layer 12, which serves as electromagnetic shielding and on which the further layers are arranged. Arranged on the layer 12 is a light guide layer 13, consisting of a low-loss material, such as silicate. Above the layer 13 there is a photocell layer 14, for example consisting of crystalline silicon, over which a circuit carrier layer 15 is arranged, which may consist for example of silicon or GaAs (gallium arsenide). Within this layer 15 there is the circuit of the processor, produced by means of highly resolving methods, for example by means of electron-beam lithography. A top layer 16 forms the upper termination of the chip. This layer, like the carrier layer 12, consists of metal and contains defined light guide tracks. Arranged between the layers 13 and 14, 14 and 15 as well as 15 and 16 there is in each case an insulating layer, denoted by 13', 14' and 15', respectively, and comprising of $SiO_2$. The said insulating layers go over into boundary layers 14'', 15'', the layers 14 and 15 being electrically separated from a metallic boundary layer 25.

Figure 3:
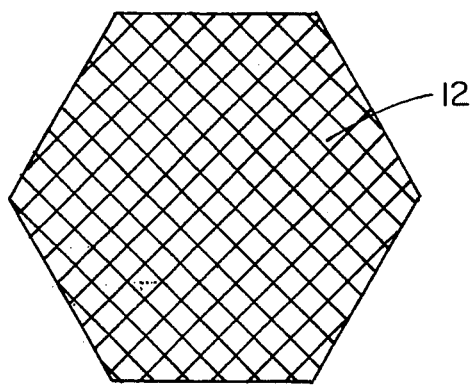
FIG. 3 shows a metallized coating.

FIG. 3 shows in plan view the region of the metallic carrier layer 12 in relation to the surface of the chip. This region has the shape of a regular hexagon, so that the individual chips can be arranged on the carrier layer 12 in a space-saving way. The interface between the layer 12 and the layer 13 is designed in such a way that the light introduced into the light guide layer 13 is reflected to the maximum extent and fed to the photocell layer.

Figure 4:
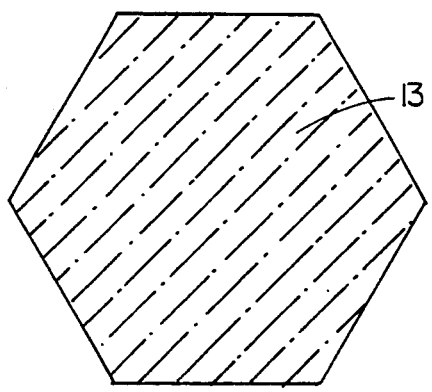
FIG. 4 shows a light guide layer.

FIG. 4 shows a plan view of the light guide layer 13. This layer too, like all other layers of the chip, is of hexagonal shape. This layer passes on the multispectral light, introduced at high power density, multimodally into the photocell layer 14.

Figure 5:
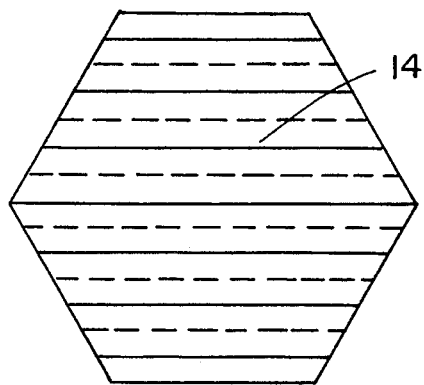
FIG. 5 shows a photocell layer.

FIG. 5 shows a plan view of the photocell layer 14. This layer has a specific number of photocells, so that when irradiated from the light guide layer 13, the layer delivers an electric voltage which is 20 to 30% higher than the voltage which is required for supplying the circuit arranged in the layer 15. Subsequently, an adequately great control range for reliable operation of the computer chip is obtained. The photocell layer 14 is separated from the circuit carrier layer 15 by an insulating layer 14', comprising of $SiO_2$.

Figure 6:
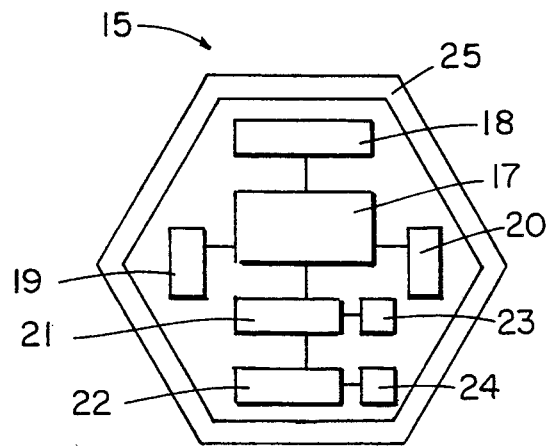
FIG. 6 shows a chip with functional units.

FIG. 6 shows a plan view of the circuit carrier layer 15. The individual functional units of the chip are built up on this layer. The figure specifically shows the following units. A processor unit 17, a supply unit 18, a programmable memory 19, a direct-access memory 20, a bus coder 21, a bus decoder 22, an optical emitter 23 as well as an optical receiver 24. The processor unit 17 may be configured as an 8-bit, 16-bit or 32-bit computer. The supply unit 18 is in connection with the photocell layer 14 and receives its input voltage from there. For this purpose, the insulating layer 14' has a corresponding vertical throughplating. The supply unit 18 stabilizes the input voltage to a predetermined value and supplies all the functional units of the chip with it via corresponding electrical conductor tracks. The functional units are highly integrated semiconductor circuits, which are interconnected via an internal electrical computer bus. The plan view also shows an uninterruptedly encircling metallic boundary layer 25, which surrounds the entire circuit arranged on the chip. Together with the metallic layers 12 and 16, this layer represents an extremely effective shielding against magnetic and electromagnetic influences. The data exchange with the other, further processor chips, grouped together in a great number in the neural network, and with the peripheral units is performed via the optical emitter 23 and via the receiver 24. Consequently, the processor is now connected to the outside world only via optical transmission paths, as a result of which minimal sensitivity to electromagnetic interference fields is obtained.

Figure 7:
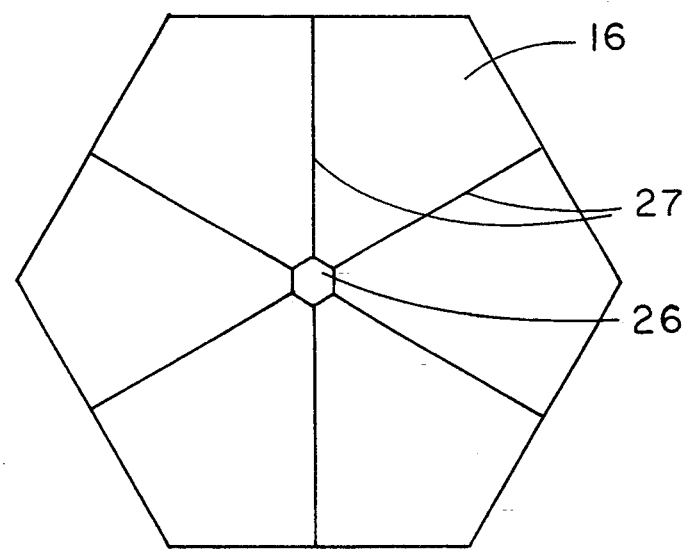
FIG. 7 shows a top layer.

FIG. 7 shows a plan view of the light guide layer 16 according to FIG. 2. This likewise hexagonally designed layer has in its center an optical node 26. Six optical waveguides 27 enter this node in a star shape. The optical waveguides 27 comprise a polymeric material of predetermined attenuation and are fitted in recessed tracks arranged within the layer 16. The node 26 acts as an optical coupling element and brings the chip-side coder and decoder units 21, 20 into optical contact with the optical waveguides 27 via the respective emitter 23 or receiver 24.

Figure 8:
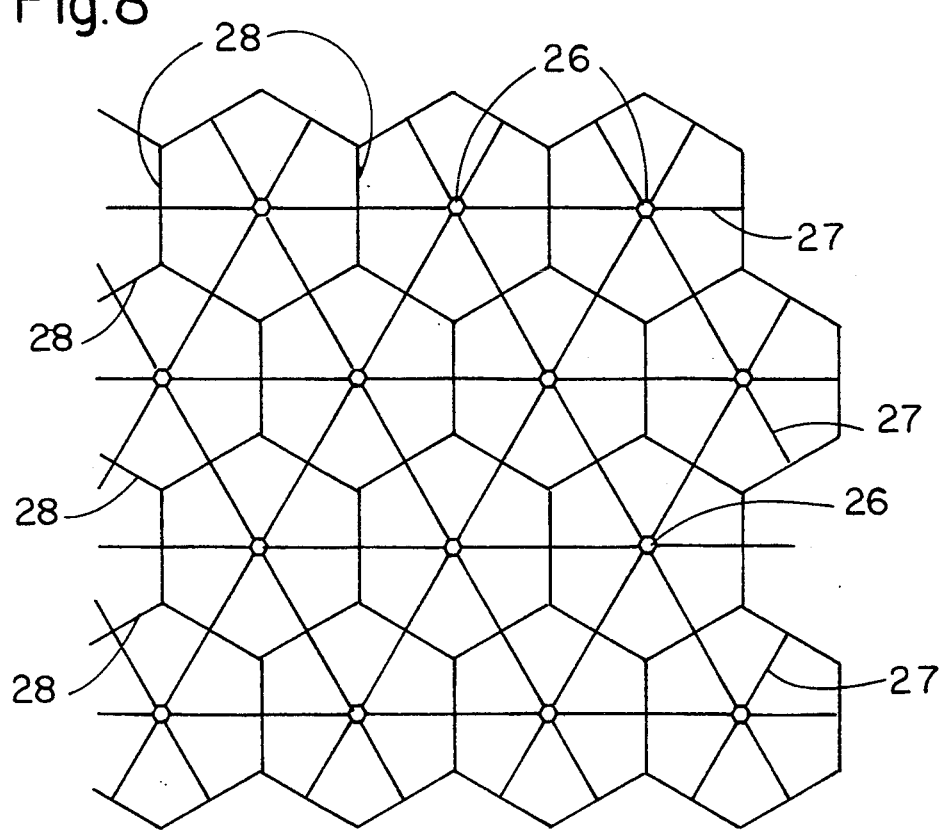
FIG. 8 shows a chip grouping.

FIG. 8 shows a cutout of a processor network, comprising a plurality of processor chips, which are joined to one another with optimum utilization of space on account of the hexagonal shape. The individual chips are in connection with one another via a network formed from the optical waveguides 27. The guides 27 are embedded in the closed carrier layer 16, which covers all the processor chips. The nodes 26 act both as active star couplers and passive star couplers of the network. On account of the hexagonal shape of the chips with the central arrangement of the nodes 26, the network forms triangular meshes with the nodes as corner points, each node 26 being connected to six optical waveguides 27. This has the result, as a geometrical special case, that all the chip boundaries 28 are crossed at right angles by the optical waveguides 27. By integration of a multiplicity of such chips with the layers 12, 13 and 15, 16 described above, in each case a processor level is formed, which is combined with further such levels to form a block. In this arrangement, optical throughplatings are provided at predetermined points of the levels, so that the processor network is given a spatial dimension of extremely high functional density.

Figure 9:
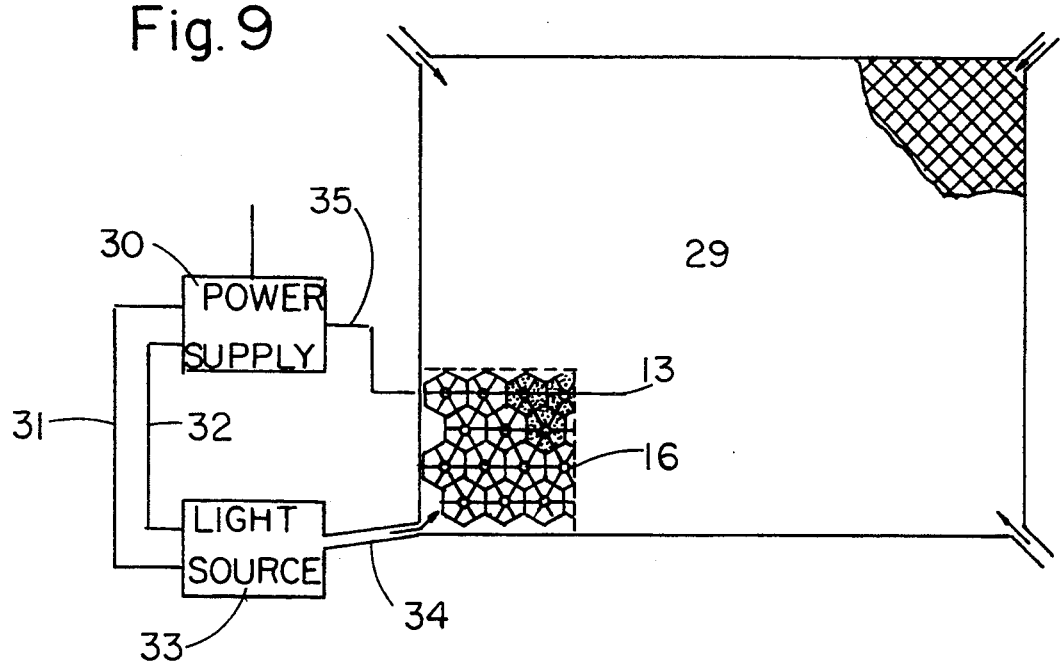
FIG. 9 shows an energy supply for a chip structure.

FIG. 9 shows the energy supply of a level 29, formed from the layers 12 to 16, of the processor network with a controlled power supply 30, which is in connection with a light source 33 via electrical lines 31, 32. The chip structure described above is shown diagrammatically at bottom left within the rectangular level 29. The top layer 16 with the optical waveguides 27 can be seen, as well as the shaded photocell layer 13, in a cutout form of representation. The light generated by the light source 33 passes via a suitable optical waveguide 34 into the light guide layer 13 of the processor level 29 and acts from there on the photocell layer 13. In the photocell layer 13, an electric voltage is thereupon produced, which serves for the electrical supply of the individual chips. An electric feed-back signal is derived from this voltage and fed via a line 35 to the energy supply 30 as reference variable.

Figure 10:
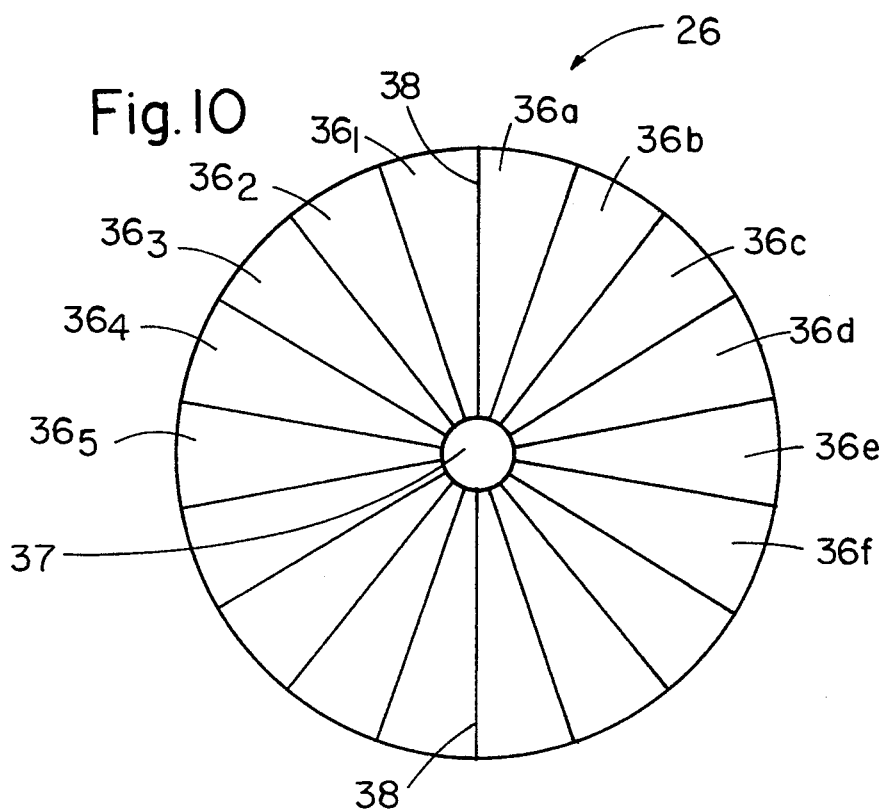
FIG. 10 shows a coupling-in point.

FIG. 10 shows a plan view of an optical node 26. This represents in practice an arrangement of circular segment-shaped photodiodes 36, which jointly cover over a closed circular area. The center 37 of the circle is left as a clearance for technical production reasons. The diodes 36 are divided into two groups by a diametral parting line 38, to be precise into emitting diodes 36a, 36b, 36c, . . . and receiving diodes, which are denoted by 36$_1$, 36$_2$, 36$_3$, . . . The individual emitting diodes 36a, 36b, 36c, . . . operate on different wavelengths (colors), each emitting diode being assigned a receiving diode, which operates at the same wavelength. Seen topographically, the arrangement comprises a plurality of emitting diodes and receiving diodes of circular segment-shaped outline in each case, the individual color segments having a color-characteristic doping and being separately drivable by means of corresponding microelectronic lines. The light-emitting surfaces of the diode arrangement are covered by a coupling element (not shown here), which establishes the optical connection between the individual diodes 36 and the optical waveguides 27. By means of these optical nodes, each processor 11 can exchange data with the other processors of the network by the combined color-division multiplex and time-division multiplex method.

Figure 11:
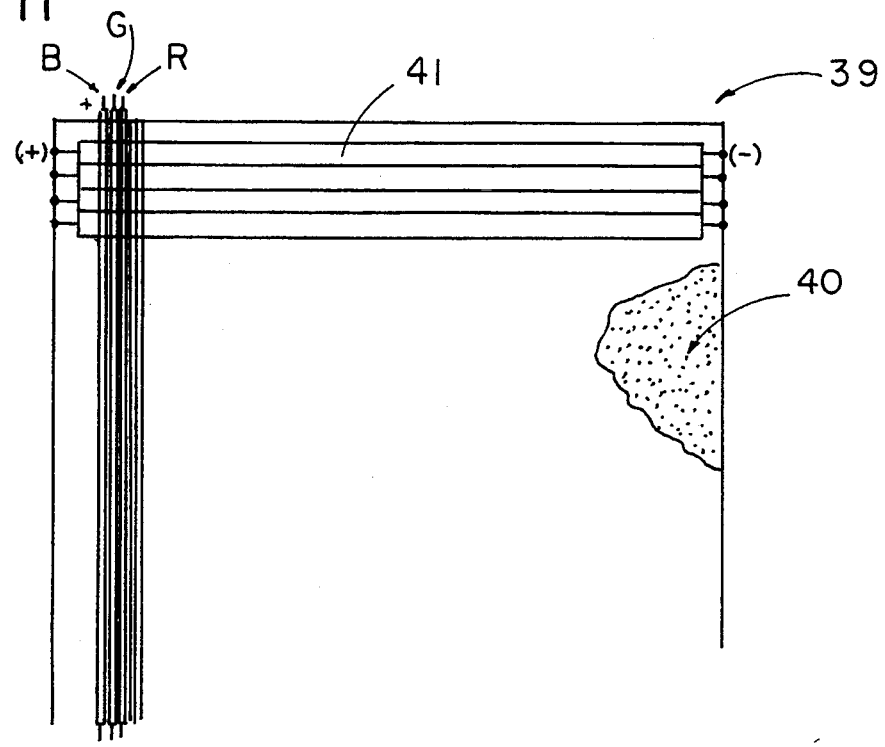
FIG. 11 shows a display unit.

FIG. 11 shows a view of a display panel (display) 39, which is arranged on a carrier plate 40. Arranged on this plate 40 are a multiplicity of strip-shaped, vertically running, individually drivable light-emitting diodes (LEDs) B,G,R; B,G,R; B,G,R; . . ., of which only a few are shown here. These diodes B,G,R, arranged in close succession, cover in a first layer the entire optically usable area of the display panel 39. The reference symbols B,G,R in this case stand for blue, green, red. The overall width of such a triplet of diodes corresponds precisely to the width of one picture element. Over this first layer there lies in a second layer a multiplicity of strip-shaped, horizontally arranged liquid crystal (LCD) elements 41. These individually drivable elements also cover the entire visible surface of the display in close succession, the width of one element 41 corresponding precisely to the height of one picture element. For protection of the arrangement, a third layer of a transparent material is provided, the surface of which is designed in such a way that outside light impinging on it is reflected diffusely. The display 39 is completely blanked when all the LCD elements 41 are at the supply voltage. As in a cathode-ray picture tube, the image to be presented is composed of picture elements and lines, here too each line comprising a series of picture elements. However, in the case of the display shown, there is no picture element-related complicated dot-matrix wiring, as is necessary in the case of directly displaying semiconductor displays. The blanking of the respective LCD line is deactivated by a deactivating pulse, so that the light-emitting diodes lying behind become visible. As a result, a cutout of the height of one picture line becomes transmissive for the LEDs lying behind. A picture element is shown when precisely one triplet B,G,R of diodes is driven. The color and brightness of the picture element are governed in this case by the driving conditions. An advantage of this solution is that picture rolling is executed by means of the LCD elements and the much faster line traversal is executed by means of the LED elements, better suited for this purpose. The build-up of such an image by picture elements and by lines, with driving of the color and brightness values, is taken over by a corresponding picture drive.

Figure 12:
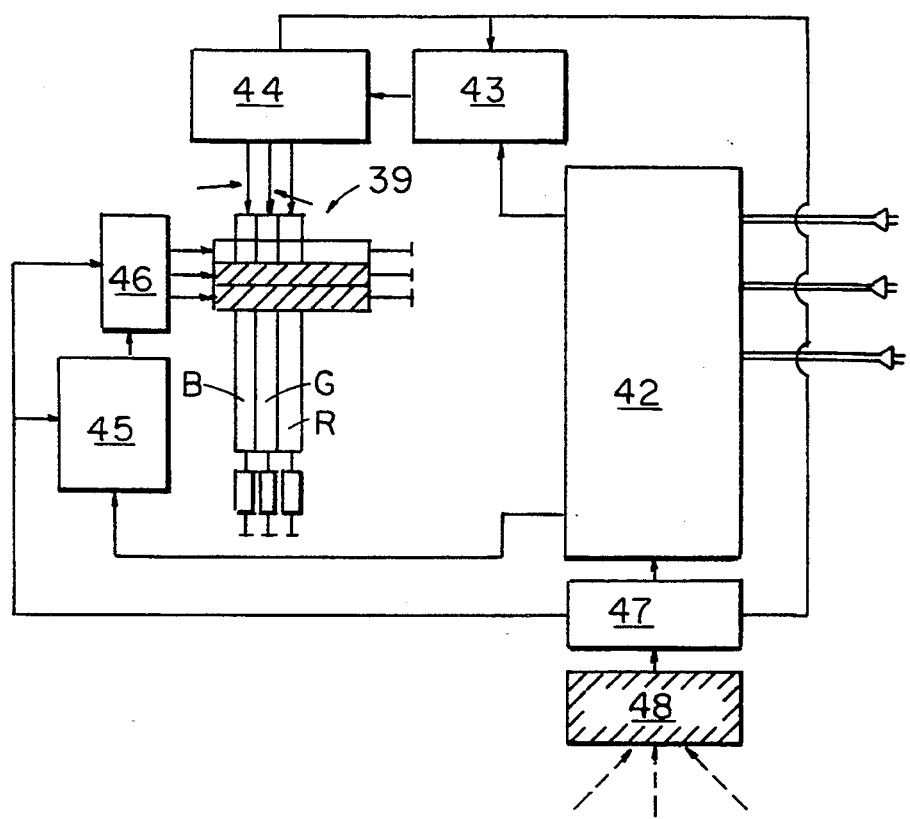
FIG. 12 shows a driving circuit for the display unit according to FIG. 11.

FIG. 12 shows the display 39 according to FIG. 11 with the LEDs B,G,R and the LCDs 41 with its outer wiring, comprising a display processor 42, an LED column control 43, an LED column driver 44 and an LCD line control 45 and an LCD line driver 46. A power supply 47, which is fed by a photovoltaic unit 48, serves for the energy supply of this circuit. This unit 48 converts light, which is radiated in, for instance from a light source, directly via the light energy carrier level, into an electric voltage, which is stabilized by the power supply 47 and passed on to the electronic units 43 to 46. The driving of the display processor 42 takes place from the processor network 1 via the optical waveguides 27. The processor 42 controls the picture elements running off per line with respect to brightness and color by means of the LED column control 43 and the column driver 44. The vertical driving of the respective LCD image line is carried out by the display processor 42 via the LCD line control 45 and the line driver 46. In this arrangement, the control signals concerned are raised to the required power level by the respective drivers. With this display it is possible to present color images running off in serial succession on a semiconductor flat screen at reduced information rate and constant image resolution in a simple form, as in the case of color television.

Figure 13:
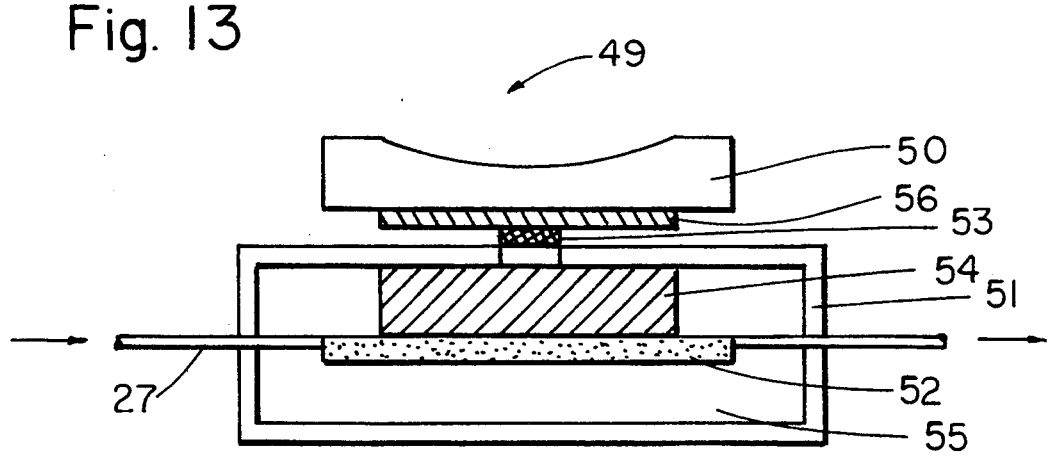
FIG. 13 shows a key element.

FIG. 13 shows a section through a keyboard element 49 with a key 50 and a capsule 51 of a magnetically shielded material, in which there is a carrier material with a liquid crystal 52. Coupled to each side of the crystal 52 is an optical waveguide 27. Above the liquid crystal 52 there is a Hall generator 54, the electric outputs of which are connected to the connections of the crystal 52. Arranged on the underside of the key 50 is a shielding plate 56, which carries a permanent magnet 53. Between the permanent magnet 53 and the Hall generator 54, an air gap is maintained by a spring. In the undepressed position of the key 50, the liquid crystal 52 is transparent, so that the luminous flux entering from the left in the direction of the arrow can pass the keyboard element 49 unhindered. If the key 50 is then depressed, the permanent magnet 50 approaches the Hall generator 54, so that the latter emits a voltage to the liquid crystal 52. As a result, the liquid crystal 52 is blanked, so that the said luminous flux is interrupted. In order that a clear off/on characteristic is obtained, it is envisaged that a threshold voltage-dependent Hall generator element is used. Consequently, a purely optically operating keyboard element which can be disturbed neither by magnetic influences nor by electromagnetic influences is obtained.

Figure 14:
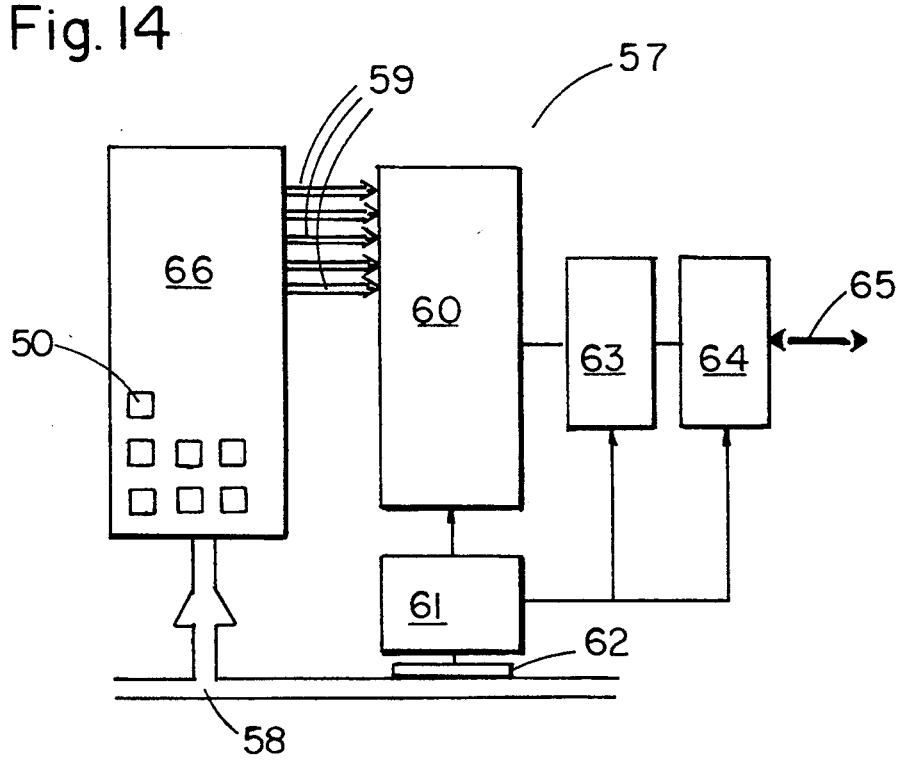
FIG. 14 shows a wiring for a keyboard with key elements according to FIG. 13.

FIG. 14 shows a circuit of an input keyboard 57, based on the keyboard elements 49, with an input panel 66, on which the individual keys 50 are arranged. The energy supply of the circuit is performed via an optical waveguide 58, to which both the input panel 66 and a photocell layer 62 are connected. The input panel 66 is connected via optical waveguides 59 to a keyboard decoder and bus coder 60. The signals delivered by the bus coder 60 pass through a modulator 63 and a light emitter 64, which is in connection with an optical waveguide 65. The voltage delivered by the photocell layer 62 is fed to an energy supply 61, which supplies the units 60, 63 and 64 with a controlled operating voltage. In the rest position of the keys 50, a maintained light signal appears on all the optical waveguides 59. If, however, a key 50 is hit, the optical waveguide 59 controlled by this key 50 passes a blanking pulse on to the keyboard decoder 60, which thereupon generates an electric digital signal corresponding to the character of the hit key 50 and passes it on to the modulator 63, which for its part is connected to the light emitter 64. The active part of this emitter 64 is formed by a laser diode, which sends its output signal to the processor network 1 described above. The units shown are arranged inside the keyboard housing. A corresponding flexible connecting cable contains both the optical waveguide 65 for the signals to be transmitted and the optical waveguide 58 for the energy supply. There are no electrical leads. Consequently, this circuit too can be influenced neither by electrical interferences nor by electromagnetic interferences.

FIG. 15 shows a microphone 66 for the input of voice signals into a computer network, the generation and transmission of the signals concerned again being performed largely by optical means. A photocell layer 67 is in connection via electrical lines with an energy supply 68, which for its part is connected to a laser diode 69. Between the laser diode 69 and a receiving diode 71 there is a light-conducting membrane 70 clamped in such a way that, in its position of rest, light of constant intensity falls on the diode 71. The voltage emitted by the diode 71 is fed to a demodulator 72. The signal delivered by the demodulator 72 passes via an amplifier 73 to the input of a frequency analyzer 74 and thereafter runs through the following functional units; a coding unit 75, a modulator 76 and an emitting diode 77. When an acoustic signal 78 impinges on the membrane 70, the latter vibrates accordingly, whereby the light refraction index of the membrane 70 is altered analogously to this signal. As a result, the light transmittance of the membrane 70 in the direction of the arrow 79 changes, so that the luminous flux flowing through the membrane 70 is also altered to the same extent. Consequently, an electric voltage modulated by the acoustic signal appears at the output of the diode 71. This audio-frequency voltage is processed in the downstream functional units for input into the computer circuit 1.

FIG. 16 shows a voice output part 80, essentially comprising an optical receiving diode 81, a decoder part 82, a voice generator 83, an amplifier 84, and a loudspeaker 85. Here too, an optronic energy supply, comprising a photocell layer 86 and a power supply unit 87, is provided. The computer circuit 1 (not shown here) is in connection with the voice output part 80 via an optical waveguide 88. The functional units 81 to 84 are, as described above, supplied with a controlled operating voltage by the power supply unit 87. If digitally modulated light signals then reach the receiving diode 81 via the optical waveguide 88, said diode converts the light signal into a corresponding electric signal, which is passed to the decoder 82. The latter only allows those signals to pass which are intended for the voice generator 83, which then composes the words to be reproduced from individual syllables. For this purpose, the voice generator 83 has a syllable memory, contained in which there is for each syllable encountered a characteristic set of commands, which determines the generation of the audio-frequency signals concerned. The frequency spectra concerned are provided by an internal digital/analog converter. Voice reproduction is then performed via the amplifier 84 with the connected loudspeaker 85.

Figure 17:
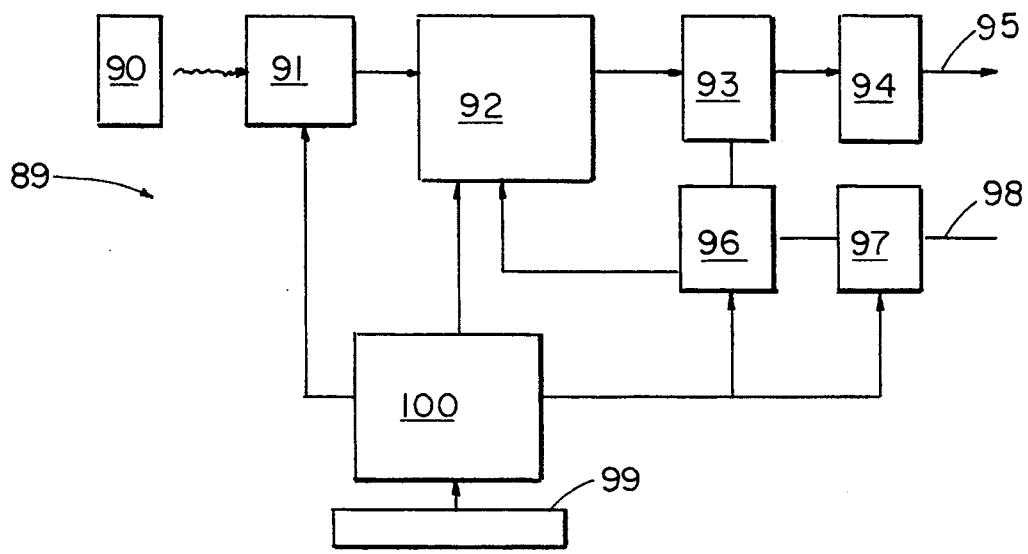
FIG. 17 shows an image sensor.

FIG. 17 shows an image sensor 89, serving to record moving color picture contents, with a lens 90, a CCD matrix image sensor 91, and an image processor 92, which is connected via an image coder 93 and a light emitter 94 to an optical waveguide 95. Furthermore, the image processor 92 is in connection via an image decoder 96 and a light receiver 97 with an optical waveguide 97. All the said functional units are realized by integrated semiconductor circuits, for the energy supply of which a photocell layer 99 and a power supply unit 100 are provided. The data exchange with the computer unit 1 (not shown) is performed via the optical waveguides 95 and 98. For energy supply, the photocell layer 99 is connected via an energy optical waveguide to a corresponding computer-side light source.

Figure 18:
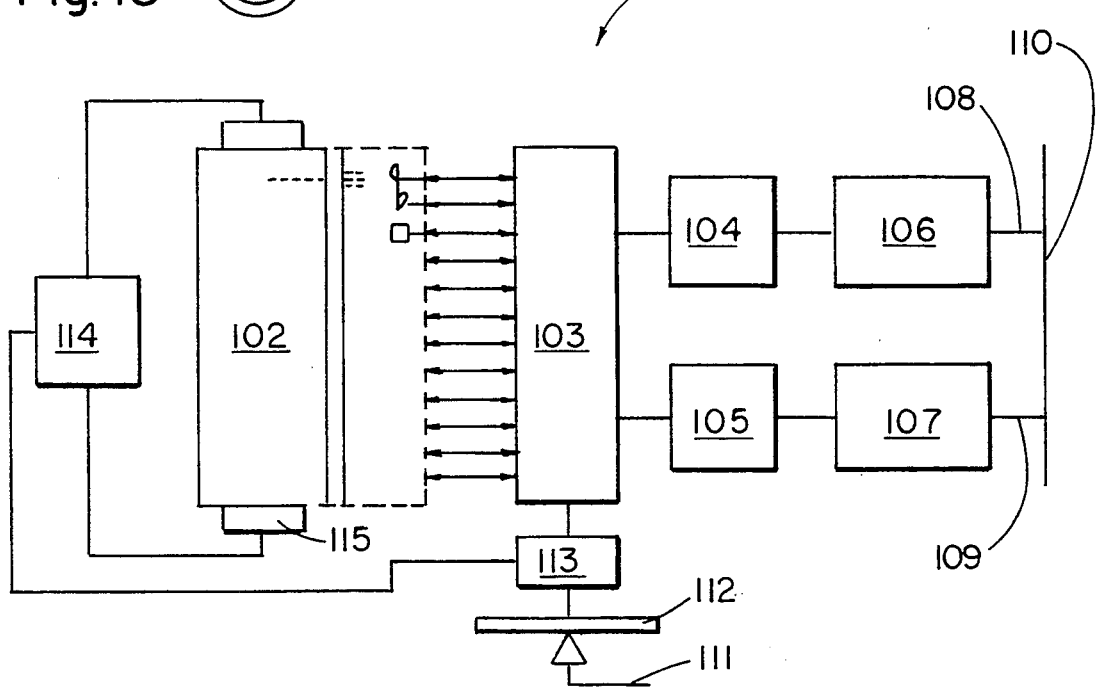
FIG. 18 shows a mass store arrangement.

FIG. 18 shows a mass store arrangement 101 with a writing reading and erasing unit 102, a writing reading erasing control 103 as well as a modulator coder 104 and a demodulator decoder 105, which are in each case connected via an optical transmitter 106 and receiver 107, respectively, via optical waveguides 108 and 109 to an optical data line 110. The supply with operating voltage is again performed via a power optical waveguide, which feeds a power supply unit 113 via a photocell layer 112. This unit supplies both the functional units 103 to 107 designed as integrated semiconductor circuits and a drive motor 115, which is preceded by a motor control 114. The actual storage element is formed by a cylindrical storage rotor 116, provided on the outside with a data carrier layer. The coating of the rotor 116 is distinguished in that data stored thereupon can be written and read optically and can be erased magnetically. The cylinder 116 is mounted in a concentrically rotatable manner inside the writing reading erasing unit 102, likewise designed as a cylinder. Detail B shows in a lateral projection the concentric arrangement of the cylinders 102 and 116. The non-rotating cylinder 102 carries on its inner side a multiplicity of writing lasers 117, reading diodes 118 and erasing heads 119, which are arranged lying directly opposite the data carrier layer. These optronic or electromagnetic elements 117 to 119 are arranged in microminiaturized form in an area-covering manner on a flexible foil, which is fastened on the inner side of the cylinder 102. Due to the rotational movement of the storage cylinder 116 and the closely compact arrangement of the access elements (writing laser 117, reading diodes 118) in the axial direction, a very large number of data tracks are defined on the circumferential surface of the cylinder 116. Since the access elements 116, 117 are arranged in a closely compact manner not only in the axial direction but also in the circumferential direction, each data track is assigned a multiplicity of these elements. All the access elements 117, 118 as well as the erasing heads 119 evenly distributed thereunder are connected via the control 103 to the nodes of the processor network 1 in parallel connection. This design of a mass store has no moving parts apart from the cylinder 116 and the motor 115. When searching for a specific stored data record, all the reading diodes 118 are activated simultaneously. This produces extremely short access times. Only fractions of a cylinder revolution elapse from a search command being activated to the data record concerned being located.

FIG. 19 shows a circuit of a combined measured-value transmitter 120 with a piezo-pressure sensor 121 and a resistance-temperature sensor 122. Both elements are connected via an analog to digital converter 123, a coder/decoder modulator 124 as well as an emitting diode 125 and a receiving diode 126 to an optical waveguide 127 in connection with the processor network. The units 123 to 126 designed as integrated semiconductor circuits receive their operating voltage from a power supply unit 128, which is fed by an energy optical waveguide 129 via a photocell layer 130. The pressure sensor 121 delivers an electric voltage proportional to the pressure detected to the A/D converter 123, which thereupon generates in a known way a digital signal corresponding to the voltage applied and introduces it into the optical waveguide 127 via the further units 124 to 126. The temperature sensor 122 forms with three resistors 131, 132, 133 an electric bridge circuit supplied by the power supply unit 128, the outgoing line of which circuit is connected to a further input of the converter 123. The operating principle of the optronic data transmission used in this case is explained in greater detail below.

FIG. 20 shows the structure of the signals transmitted within the processor network. In principle, three types of information are transmitted, namely the processor function addresses, the data priority information and the data content information. The data content information is divided into the data address and the data content itself. The entire data traffic within the multiprocessor network is handled with these three types of information.

The processor function addresses are necessary to allow the parallel processing of certain areas of activity ordered in self-organized form in the neural network. For this purpose, certain so-called main processor areas are defined, which are in each case assigned to specific activity areas. One such area of activity is, for example, the processing of data input by means of the keyboard. For example, with each data input via the keyboard, six specific processors are addressed as primarily assigned processors by their processor function address in the form of a fixed color-division multiplex code. These processors thereby check in a selection of five out of six whether the following data are correctly transmitted. If a processor deviates with its test result from the result of the other five, it is switched off as faulty. The remaining processors continue testing by the same procedure and appoint a neighboring standard processor as the main processor, which now takes over the tasks of the switched-off processor.

The data priority information represents a further important transmission parameter, since it indicates the degree of importance, that is to say the priority, of an item of information. A distinction is initially drawn between data of high priority and data of low priority. Data of high priority are sent directly at 50% of the color carrier amplitude without base carrier component. Data of low priority are modulated to 50% of constant color carrier amplitude. This measure achieves the effect that highly modulated signals 134, that is to say the signals of high priority, experience priority treatment by the decoder circuits of the neural network.

The data content information comprises two parts, namely a specific data address as well as the actual data to be transmitted. In this case, each part forms a digital data message of specific bit length.

The three types of data mentioned above represent the basis of the overall, self-organizing data transmission inside and outside the neural network, the operating principle of which is explained as follows. For this computer there is no superordinated overall running program, instead data processing and data management are executed according to procedure patterns organized by the computer itself. Each individual processor has its own operating system, which enables it to carry out the internal program run organization and organize the external communication with the other processors. The respective processor-own operating system is stored in a corresponding EEPROM.

In order to avoid data collisions on the optical data bus network, after each information cycle, comprising the transmissions of the processor function address, the priority information, and the data content information, all the processors are switched to reception again. If a main processor area has information of data priority 1, it initially sends its processor function address into the bus network and starts the latter with a single-color carrier signal, which immediately applies as transmit-blocking signal for all other main processors. In order that all the processors operating on priority level 1 receive access to the data bus, this so-called key signal is assigned cyclically to all the main processors. After one complete cycle, the bus is cleared for the data traffic of priority level 2. This operates by the same procedure but, after the termination of its cycle, if there are priority data of level 1, can wait again for a free priority gap. However, in order not to have to wait endlessly in the event of considerable data of priority level 1 occurring, after the third cycle for level 1 a free cycle for level 2 is fixed. The various data content information is thereby transmitted by the parallel method via all the color carriers available. Consequently, a maximum throughput rate via the bus network is ensured.

If at this stage more complex tasks, such as those of pattern recognition, for example of voice analysis, are carried out, initially the area specified for this task as described above is addressed by main processors. These then keep switching freely available standard processors on into task mode until their number is adequate for meaningful real-time processing in parallel operation. In this case, for example, predetermined images or patterns are segmented in parallel and initially taken over in the free RAMs of the main and standard processors, which then for their part address segment sectors and tracks assigned to them on the optomagnetic mass store by means of the communication procedure described above. Here, the processed pattern sequences are stored permanently. If, within a learning process, the computer can remember a certain image pattern sequence by comparison with a predetermined pattern sequence, it compares per processor the pattern segment located in the mass store with the segment located in the RAM. Deviations can consequently be recognized as erroneous and eliminated.

A refinement of the invention which is not shown consists in that the processor chip 11 is of square or rectangular shape.

A further refinement of the invention which is not shown consists in that the storage cylinder 116 is provided on the outside and inside with a data carrier layer.

I claim:

1. Digital computer having a plurality of processors, the processors being connected by means of optical waveguides for the transmission of signals, said optical waveguides being connected to form an optical waveguide network, each node of the optical waveguide network being assigned at least one processor chip which is coupled to the node via an optical emitter and an optical receiver in such a way that an information exchange between the processor chip assigned to the node and the optical waveguide network is performed via the respective optical node, each said processor chip being electromagnetically shielded on all sides, each said processor chip being supplied the energy required for operation via photocells arranged outside the metallic shielding, as light energy via a light guide layer in such a way that, in energy consumption and communication, there is no direct electrical connection between the energy sources and the processor chips on the one hand and the optical waveguide network and the processor chips on the other hand.

2. The digital computer according to claim 1, further including photovoltaic converter, assigned to each processor chip, for the conversion of incident light into an electric voltage serving for the power supply of the processor chip, with said processor chip having a light guide layer of an optically transparent material and a photocell layer.

3. The digital computer according to claim 1, wherein said optical node has a multiplicity of receiving diodes and emitting diodes which operate in pairs at the same color frequency.

4. The digital computer according to claim 1, in which each processor chip has a hexagonal outline shape, and wherein a multiplicity of processor chips are combined in an interlocking manner to form a processor level, the chip boundaries being formed by the metallic boundary layer.

5. The digital computer according to claim 1, wherein the meshes of the light guide network have the shape of equilateral triangles.

6. The digital computer according to claim 4, wherein a multiplicity of said processor levels are combined to form a block with optical data paths between the individual processor levels existing at suitable points.

7. The digital computer according to claim 1, wherein the digital computer is interfaced to a peripheral device and wherein a photocell layer is provided for energy supply, which is in connection with an energy light guide.

* * * * *